United States Patent [19]
Eriksson

[11] Patent Number: 4,797,578
[45] Date of Patent: Jan. 10, 1989

[54] ARRANGEMENT FOR ADJUSTING AN IMPEDANCE NETWORK IN AN INTEGRATED SEMICONDUCTOR CIRCUIT

[75] Inventor: Hans O. Eriksson, Järfälla, Sweden

[73] Assignee: Telefonaktiebolaget L M Ericsson, Stockholm, Sweden

[21] Appl. No.: 942,769

[22] Filed: Dec. 17, 1986

[30] Foreign Application Priority Data

Dec. 19, 1985 [SE] Sweden ............... 8506023

[51] Int. Cl.$^4$ .................. H01L 27/02; G05F 5/00
[52] U.S. Cl. .................... 307/303; 307/270; 357/51
[58] Field of Search .............. 307/303, 270; 357/51; 365/96, 103

[56] References Cited

U.S. PATENT DOCUMENTS

| | | | |
|---|---|---|---|
| 4,225,878 | 9/1980 | Dobkin | 357/51 |
| 4,412,241 | 10/1983 | Nelson | 357/51 |
| 4,460,914 | 7/1984 | te Velde et al. | 357/51 |

FOREIGN PATENT DOCUMENTS

2715937 10/1978 Fed. Rep. of Germany.

OTHER PUBLICATIONS

"A Precision Trim Technique for Monolithic Analog Circuits", George Erdi, IEEE Journal of Solid State Circuits, vol. SC10, No. 6, Dec. 1975 (pp. 412–416).

*Primary Examiner*—Stanley D. Miller
*Assistant Examiner*—Richard Roseen
*Attorney, Agent, or Firm*—Burns, Doane, Swecker & Mathis

[57] ABSTRACT

An integrated semiconductor circuit has the impedance networks (R11, R12, R13; R21, R22, R23) which can be adjusted with adjustment impedances (R14, R15; R24, R25). These are connected with the aid of adjustment circuits including a thyristor (TY1–TY4) and a short-circuiting zenerdiode (ZZ1–ZZ4). To avoid extra terminals for the adjustment circuit this is connected between two current terminals (6, 7) necessary for the normal operation of the semiconductor circuit. The electrode (11) of the thyristor (TY1–TY4) is connected to a signal input (E0–E3) which is also necessary for the normal operation. During adjustment, a voltage source is connected to one of the signal inputs (E0–E3) so that the corresponding thyristor (TY1–TY4) will become conductive and a current source is connected between the current terminals (6, 7). The current short-circuits the corresponding zenerdiode (ZZ1–ZZ4) so that the adjustment impedance is connected in parallel. The integrated circuit and its connection lines (12, 13, 14) are intended to withstand in normal operation the voltages and currents present during adjustment. The arrangement allows impedance adjustment of a ready-encapsulated integrated circuit, merely the exterior terminals needed for the normal operation of the circuit being utilized. Extra exterior terminals requiring room on a circuit board are avoided.

17 Claims, 3 Drawing Sheets

ARRANGEMENT FOR ADJUSTING AN IMPEDANCE NETWORK IN AN INTEGRATED SEMICONDUCTOR CIRCUIT

TECHNICAL FIELD

The invention relates to an arrangement for adjusting an impedance network in an integrated semiconductor circuit, the network being connected to at least one adjustment impedance, which with the aid of an adjustment circuit can be connected in parallel or in series with the impedance network by a current switching means in the adjustment circuit which can close or break a current path, the means being caused to change its state by the connection of a current.

BACKGROUND ART

The U.S. Pat. No. 4,412,241 illustrates an adjustment device for an integrated semiconductor circuit in which the adjustment resistors can be coupled in or out with the aid of a fuse or a short-circuiting zenerdiode, a so-called zenerzap diode. The adjustment device has two current terminals for a current which triggers the fuse or short-circuits the zenerzap diode. One terminal is only utilised during adjustment, while the other terminal is also utilised for current supply to the integrated circuit in normal operation. The device enables adjustment of the resistors after the integrated circuit has been enclosed in its capsule. This situation is utilised when a very accurate adjustment is required, since the resistance value of the resistors can be changed, e.g. when soldering the integrated circuit in the capsule. In the illustrated device the capsule requires here an extra exterior terminal which is connected to one of the current terminals. An integrated circuit which has many adjustment devices requires a corresponding number of extra external terminals which are only utilised once during adjustment. The extra exterior terminals result in that a larger and more expensive capsule must be used and that extra space is required on the circuit board where the capsule is mounted, which limits the possibilities of providing high packing density of components on the circuit board.

DISCLOSURE OF INVENTION

The above-mentioned restriction is avoided in accordance with the invention by an arrangement allowing impedance adjustment of a ready-capsulated circuit being able to take place with the availability of merely the exterior terminals which are required for normal operation of the circuit. The invention is characterized by the disclosures in the accompanying claims.

BRIEF DESCRIPTION OF DRAWINGS

An embodiment of the invention will now be described in detail with reference to a drawing, on which

BEST MODE FOR CARRYING OUT THE INVENTION

Figure 1:
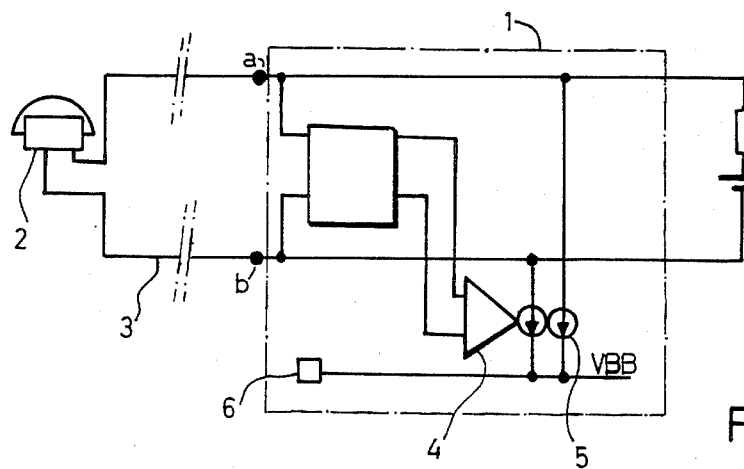
FIG. 1 is a block diagram of a subscriber line circuit in a telephone exchange.
Figure 2:
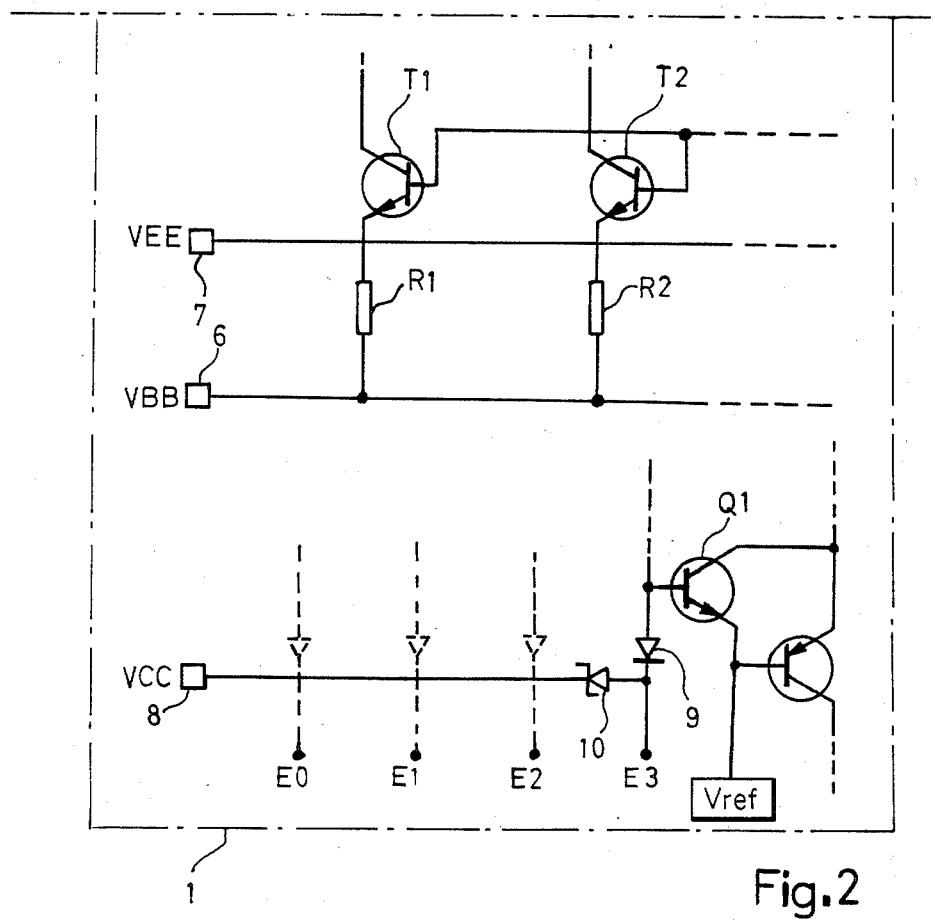
FIG. 2 is a circuit diagram with current and signal terminals in a known subscriber line circuit.

An embodiment of the invention will now be described below in connection with a subscriber line circuit 1 in a telephone exchange, schematically illustrated and bounded by dashed lines in FIG. 1. The known circuit is an integrated semiconductor circuit to which lines 3 from a subscriber 2 are connected at terminal points a and b. The lines 3 are supplied with current via an amplifier 4 from current generators 5. Voltages e.g. from a power line, can be induced in the lines 3, and these give rise to a potential difference between the terminal points a and b. It is a requirement from the telephone authorities that this potential difference shall fall below a given value, which requires that the current generators 5 have current-voltage characteristics which are in accurate mutual agreement. The outputs of the current generators are connected to a current terminal 6, and in normal operation this terminal is connected to a reference potential VBB which is here −50 V in relation to earth potential. The outputs of the current generators 5 are illustrated in more detail in FIG. 2, each of them having a transistor T1 or T2 with its respective emitter resistor R1 or R2, which are connected to the current terminal 6. The current-voltage characteristics of the current generators 5 are dependent on the emitter resistors R1 and R2. The latter are to be adjusted accurately, and this may be done in the inventive way, which will be described below. In FIG. 2 there are also shown current terminals 7 and 8 and signal inputs E0, E1, E2 and E3 to the subscriber line circuit 1. These inputs are necessary for the normal function of the circuit and are essential for the inventive adjustment arrangement.

The circuit 1 is supplied with current via the current terminals 7 and 8, and during normal operation they have the potentials VEE=−5 V and VCC=+5 V. Signals with the aid of which the functions of the subscriber line circuit are controlled are connected to the signal inputs. In the present embodiment the signals are digital, and during normal operation they assume potentials between 0 and +5 V. Via a diode 9 the signal inputs are connected to the base on their respective individual transistor Q1, the emitter of which is kept at a potential V ref=1.4 V during normal operation. The transistor Q1 withstands a base-emitter back voltage of at most 7 V, and to prevent an unintentional base-emitter breakthrough the signal inputs are connected to the current terminal 8 via a zener diode 10. In normal operation the current terminal 8 has a potential of +5 V, and the potential of the signal inputs will be restricted to an interval of between +6 V and −2 V by the zener diode 10. There is thus prevented a base-emitter breakthrough if the signal terminal is subjected to an incorrect voltage.

The above-described current terminals and signal inputs are used in accordance with the invention in adjusting the emitter resistors R1 and R2 in the way described in connection with FIG. 3. The emitter resistor of the transistor T1 is a resistance network comprising three resistors R11, R12, R13 coupled in series with each other. For adjustment, adjustment resistors R14 and R15 can be connected in parallel to the resistance network. The resistor R11 is connected to the emitter output of the transistor T1 and the resistor R13 is connected to the current terminal 6. The resistor R14 has one pole connected to the connection point 15 between the resistors R11 and R12. The other pole of the resistor R14 is connected to an adjustment circuit which includes a short-circuiting zener diode ZZ1, a so-called zenerzap diode, and a thyristor TY1. The zenerzap diode ZZ1 has a very large resistance in its original unactuated condition when it is biased in the back direction and can be short-circuited with a current as described, e.g., in the IEEE Journal of Solid State Circuits, Vol. S C 10 No. 6, December 1975, George Erdi: "A Precision Trim Technique for Monolithic Analog Circuits". The anode 17 of the zenerzap diode ZZ1 is connected to the current terminal 6, the anode 18 of the thyristor TY1 is connected to the current terminal 7 and has its control input 11 connected via a diode D1 to the signal input E0 and a connection point 16 between the cathodes of the thyristor TY1 and the short-circuiting zenerzap diode ZZ1 is connected to the other pole of the resistor R14. The resistor 15 is correspondingly connected to the resistors R12 and R13 and to an adjustment circuit. The latter has a zenerzap diode ZZ2 and a thyristor TY2, the control input of which is connected via a diode D2 to the signal input E1, as will be seen from FIG. 3.

To adjust the emitter resistor of the transistor T1, the resistor R14, for example, is connected in parallel in the following inventive way. The current terminal 7 is connected to earth potential and the signal input E0 is connected to a voltage source with a potential within the range $-1$ to $-5$ V, so that the thyristor TY1 becomes conductive. A current source is then connected by its positive pole to the current terminal 7 and by its negative pole to the current terminal 6. The current source is implemented such that it sends a current pulse having a maximum voltage and energy content adapted for short-circuiting the zenerzap diode ZZ1. The resistor R15 can be connected in parallel in a corresponding manner by the zenerzap diode ZZ2 being short-circuited. The voltage source is thus connected between the current terminal 7 and the signal input E1 and the current source between the current terminals 6 and 7. The emitter resistance for the transistor T1 can be adjusted in the illustrated arrangement in three steps of desired magnitude, by either one or both resistors R14 and R15 being connected in parallel. By selecting which of the signal inputs the voltage source is connected to, it is possible to select which of the resistors R14 and R15 are to be connected.

In the parallel connection of the resistor R14, the signal input E0 and its connection line 14 is subjected to a current of signal strength. The connection line 14 is adapted to withstand this current strength in normal operation of the integrated circuit. The short-circuiting current for the zenerzap diode ZZ1 is supplied via the current terminals 6 and 7, the connection lines 12 and 13 of which are adapted to withstand in normal operation a current corresponding to the short-circuiting currents. As mentioned, the current terminals 6 and 7 have the potentials of $-50$ V and $-5$ V, respectively, during normal operation. During adjustment, the current terminal 7 is earthed and the potential of the current terminal 6 can be limited to approximately $-5$ V, so that no potentials dangerous to the current connections are present during adjustment.

The signal inputs E0, E1, E2, E3 have a potential of between 0 and $+5$ V in normal operation. During adjustment, the signal inputs have a potential of between 0 and $-5$ V. The circuit element which could be damaged by this potential is the transistor Q1, which has been described in connection with FIG. 2. To avoid damage, the emitter of the transistor Q1 is connected to earth potential (V ref=0) during adjustment, so that the voltage limit of 7 V for base-emitter breakthrough is not reached. The zenerdiode 10 prevents short-circuiting of the zenerzap diodes during normal operation when the current terminal 7 has the potential VEE= $-5$ V and the current terminal 8 has the potential VCC= $+5$ V. The potential of the signal inputs is limited by the zenerdiode 10 to be lowest at $-2$ V, so that the control input of the thyristor TY1 will be back-biased and will prevent current going through the zenerzap diode ZZ1.

Figure 3:
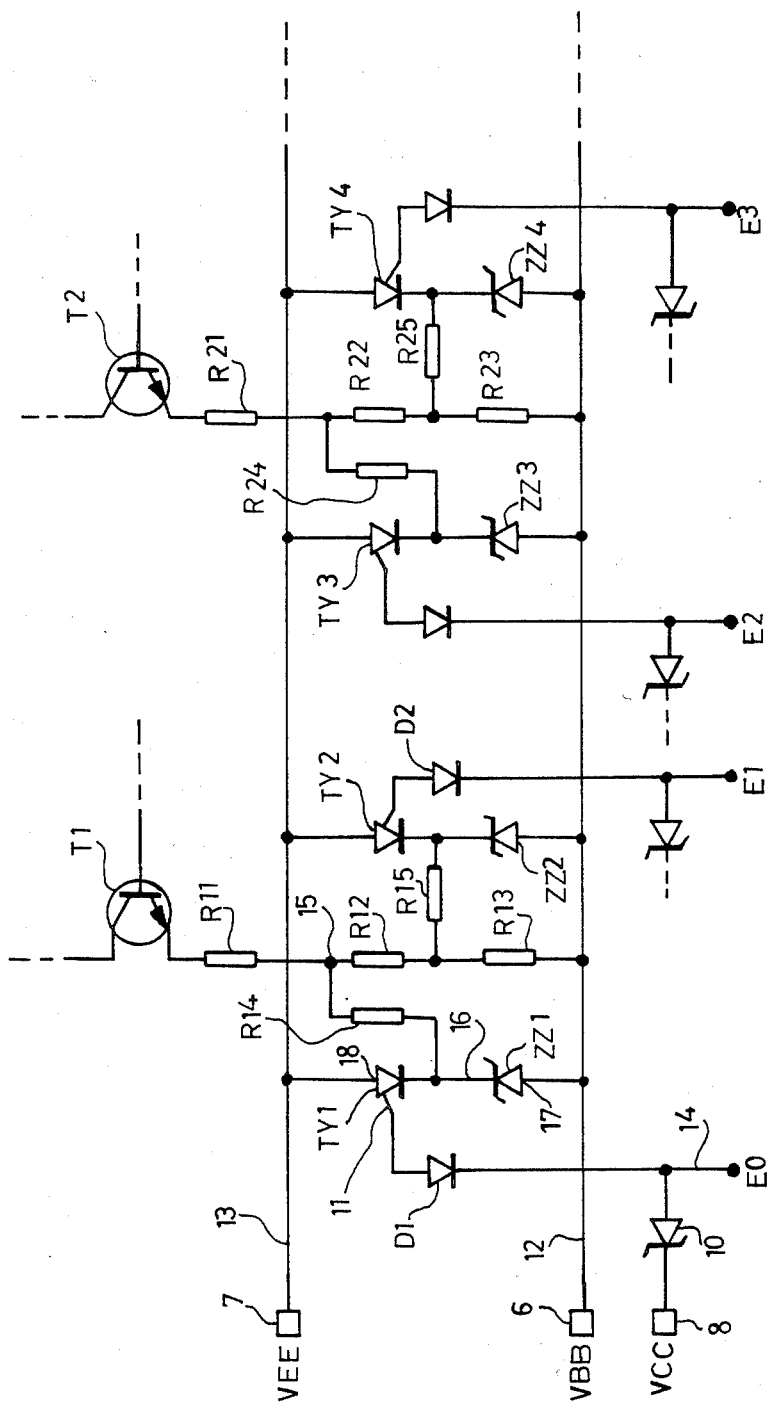
FIG. 3 is a circuit diagram showing inventive current and signal terminals in a subscriber line circuit.

The transistor T2 is also illustrated in FIG. 3, its emitter resistance comprising three series-connected resistors R21, R22 and R23, to which two adjustment resistors R24 and R25 may be connected in parallel. The connection takes place with adjustment circuits in the same way as described above for the transistor T1. By conventionally selecting the resistors R11-R15 and the resistors R21-R25, the relationship between the emitter resistors can be adjusted stepwise in a large number of combinations.

Figure 4:
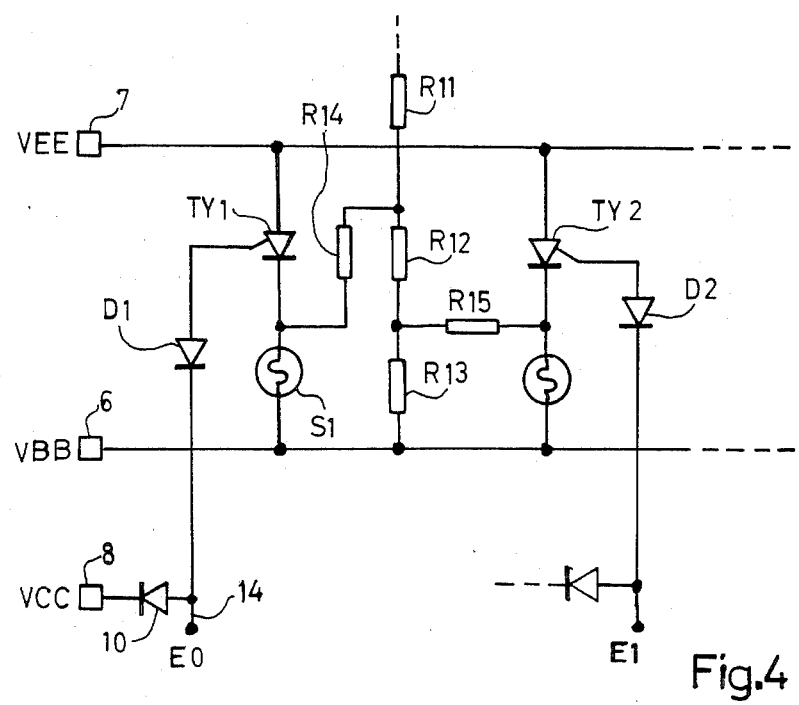
FIG. 4 is a circuit diagram illustrating an alternative embodiment of the invention and FIG. 5 is a circuit diagram illustrating a further embodiment of the invention.

In an alternative embodiment of the adjustment arrangement illustrated, the zenerzap diodes may be exchanged for fuses. This embodiment is illustrated in FIG. 4 with a fuse S1, which can be broken by the current which is fed out with the aid of the thyristor TY1 between the current terminals 6 and 7 in the way described above. By signal input selection it is possible to select which fuse shall be broken, in the same way as described for the zenerzap diodes in connection with FIG. 3.

Figure 5:
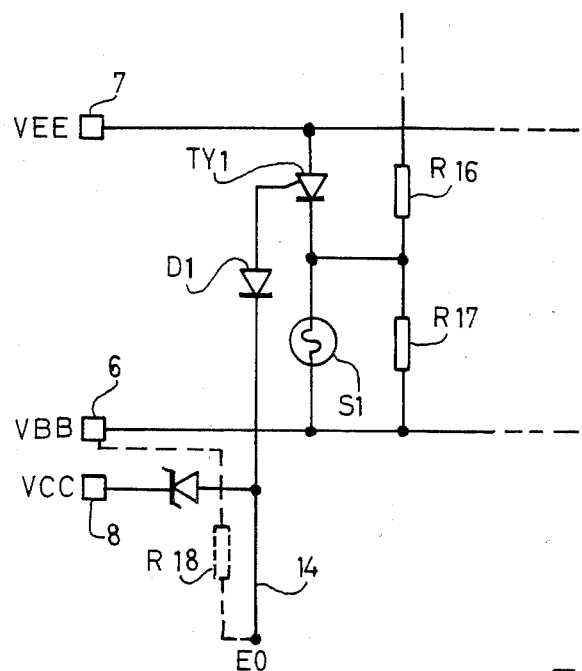

In the embodiment with fuses, the resistor R14, for example, is disconnected, this resistor having been connected in parallel with the resistor R12 in series with the resistor R13 before adjustment. In FIG. 5, an alternative embodiment has an adjustment resistor R17, which can be connected in series with the resistor R16. This takes place with the aid of the adjustment circuit containing the thyristor TY1 and the fuse S1, the latter being broken in the way described above. Alternatively, the fuse can be replaced by a zenerzap diode, the resistor R17 being disconnected when this diode is short-circuited.

An alternative arrangement for connecting the voltage to the control input of the thyristor TY1 is also illustrated in FIG. 5. The signal input E0 is here connected to the current terminal 6 via a resistor R18 indicated by dashed lines in the Figure. During adjustment, the current terminals 7 and 8 are connected to earth potential as described above. A current-voltage source is connected with its negative pole to the current terminal 6 and with its positive pole to the current terminal 7. The current source may send a current pulse with strength and duration adapted for breaking the fuse. The maximum voltage of the current-voltage source is selected so that no components are unintentionally damaged, and the current through the connection line 14 is limited by the resistor R18, which has a resistance in the order of magnitude 2 kohm. When the current-voltage source is connected, the signal current in the control electrode of the thyristor TY1 grows to a value where the thyristor is excited and the current pulse passes through the fuse to break it.

An obvious alternative to the illustrated embodiments is that the resistors in the resistance network and the adjustment resistors are exchanged for combinations of resistors, capacitors and coils. There is thus obtained an impedance network having an impedance which is adjusted by the inventive arrangement. It is also obvious that the thyristor can be exchanged for any other controllable current switching means. e.g. a transistor.

The invention has been described above in connection with an integrated semiconductor circuit for connection to a subscriber line in a telephone exchange, but is not limited to this particular use. The invention can be utilised in impedance adjustment of an integrated semiconductor circuit as soon as this circuit has a current terminal connected to an impedance network, a further current terminal and at least one signal input. The current terminals and signal inputs will be utilised for normal operation of the circuit, and thus withstand the current strengths and potentials present during adjustment.

The adjustment arrangement in accordance with the invention has the advantage in relation to known apparatus that the adjustment can take place on a ready and capsulated integrated circuit, where only the exterior terminals of the capsule are accessible without the capsule being unnecessarily voluminous. The adjustment circuit with the adjustment impedances is formed such that it does not disturb the normal operation of the integrated semiconductor circuit.

I claim:

1. In an integrated semiconductor circuit of the type having first and second power supply terminals for applying an operating current to the circuit and at least one signal terminal for providing an input signal to the circuit during normal operation, an arrangement for adjusting the impedance value of an impedance network within said circuit, comprising:

an adjustment impedance connected to said impedance network;

an adjustment circuit connected between said first and second power supply terminals, said adjustment circuit including a current switching means which can be set into one of two selectable states to respectively close or open a current path from said adjustment impedance to said first or second power supply terminals, and a selectively controllable switch means connected to said current switching means for selectively setting the state of said current switching means, said selectively controllable switch means having a control electrode connected to said signal input terminal and being responsive to a signal during adjustment at said input terminal to selectively apply a current to said current switching means with at least one of said first and second power supply terminals having a different voltage during adjustment than during normal operation, said signal input terminal being operably connected with means to prevent said selectively controllable switch means from applying current to said current switching means during normal operation.

2. Arrangement for adjusting an impedance network as claimed in claim 1, characterized in that the current switching means has a first pole connected to the first power supply terminal, the selectively controllable switch means has a first pole connected to the second power supply terminal, and the current switching means and the selectively controllable switch means each having second poles which are connected to each other at a connection point, to which one pole of the adjustment impedance is connected.

3. Arrangement for adjusting an impedance network as claimed in claim 1, characterized in that, during adjustment, the first power supply terminal is connected to the signal input terminal via an impedance so that when a current source is connected between the first and second power supply terminals for changing the state of the current switching means, a control signal is provided to the control electrode of the selectively controllable switch means via the impedance.

4. Arrangement for adjusting an impedance network as claimed in claim 1, characterized in that the current switching means is a fuse.

5. Arrangement for adjusting an impedance network as claimed in claim 1, characterized in that the current switching means is a short-circuiting zener diode.

6. Arrangement for adjusting an impedance network as claimed in claim 1, characterized in that the selectively controllable switch means is a thyristor.

7. Arrangement for adjusting an impedance network as claimed in claim 2, characterized in that, during adjustment, the first power supply terminal is connected to the signal input terminal via an impedance so that when a current source is connected between the first and second power supply terminals for changing the state of the current switching means, a control signal is provided to the control electrode of the selectively controllable switch means via the impedance.

8. Arrangement for adjusting an impedance network as claimed in claim 2, characterized in that the current switching means is a fuse.

9. Arrangement for adjusting an impedance network as claimed in claim 3, characterized in that the current switching means is a fuse.

10. Arrangement for adjusting an impedance network as claimed in claim 7, characterized in that the current switching means is a fuse.

11. Arrangement for adjusting an impedance network as claimed in claim 2, characterized in that the current switching means is a short-circuiting zener diode.

12. Arrangement for adjusting an impedance network as claimed in claim 3, characterized in that the current switching means is a short-circuiting zener diode.

13. Arrangement for adjusting an impedance network as claimed in claim 7, characterized in that the current switching means is a short-circuiting zener diode.

14. Arrangement for adjusting an impedance network as claimed in claim 2, characterized in that the selectively controllable switch means is a thyristor.

15. Arrangement for adjusting an impedance network as claimed in claim 3, characterized in that the selectively controllable switch means is a thyristor.

16. Arrangement for adjusting an impedance network as claimed in claim 7, characterized in that the selectively controllable switch means is a thyristor.

17. Arrangement for adjusting an impedance network as claimed in claim 4, characterized in that the selectively controllable switch means is a thyristor.

* * * * *